United States Patent [19]

Lueneburger

[11] Patent Number: 5,343,365
[45] Date of Patent: Aug. 30, 1994

[54] PCB RELAY HAVING AN IMPROVED TERMINAL STRUCTURE

[75] Inventor: Klaus Lueneburger, Evansville, Ind.

[73] Assignee: Potter & Brumfield, Inc., Princeton, Ind.

[21] Appl. No.: 950,389

[22] Filed: Sep. 23, 1992

[51] Int. Cl.5 ............................................. H01R 9/00
[52] U.S. Cl. ..................... 361/773; 361/776; 361/807; 361/808; 361/809; 439/912
[58] Field of Search ............ 324/158 F, 158 P; 361/773, 776, 807, 808, 809; 439/483, 912, 912.1

[56] References Cited

U.S. PATENT DOCUMENTS 4,602,230 7/1986 Schedele ........................ 335/79

FOREIGN PATENT DOCUMENTS 0409613 1/1991 European Pat. Off. .
8433017 2/1985 Fed. Rep. of Germany .
3513296 9/1985 Fed. Rep. of Germany .
8605210 5/1987 Fed. Rep. of Germany .
0546193 2/1958 Italy ..................... 439/912

Primary Examiner—Leo P. Picard
Assistant Examiner—Donald A. Sparks
Attorney, Agent, or Firm—Joseph S. Codispoti

[57] ABSTRACT

A PCB relay comprising a housing having a bottom side, a top side and a circumferential wall and terminal pins protruding from the bottom side for being contacted to a printed circuit board. For conducting heavy load currents from the relay contacts and away from the printed circuit board in a quick manner and via a short pathway, at least two conducting strips are fastened to the circumferential wall of the housing, extending from the bottom side to the top side. The strips form soldering pins at the bottom end thereof and quick-connect plugs or terminals at the top end thereof. An electrically conducting connection between the strips and the terminal pins of the relay may be formed on the PCB or, alternatively, the elements may be directly connected to one another.

14 Claims, 3 Drawing Sheets

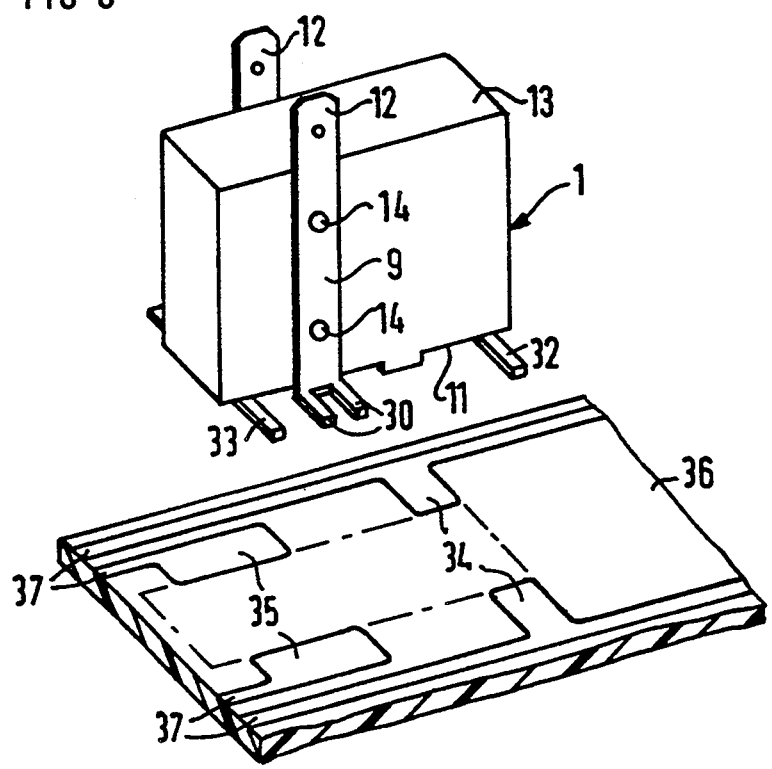

PCB RELAY HAVING AN IMPROVED TERMINAL STRUCTURE

TECHNICAL FIELD

The present invention relates to a relay for use on a printed circuit board. More particularly, the invention relates to a relay comprising a housing having a bottom side, a top side and a circumferential wall and soldering terminal pins protruding from said bottom side for being contacted to a printed circuit board.

BACKGROUND OF THE INVENTION

In many types of electrical equipment, low-voltage controlled relays are required to switch heavy load current. If, in such applications, the control circuit is designed to be implemented on a printed circuit board (PCB), a relay with PCB terminal pins must be used. However, for thermal reasons, PCB conductor paths are not capable of conducting heavy load current over long distances. Consequently, such PCB relays are provided with additional quick-connect terminals that have greater cross-sections than the PCB conductor paths to conduct the load current away from the PCB circuit.

A relay specifically designed to accomplish this purpose is described in U.S. Pat. No. 4,602,230. The described relay has contact rails extending from a side wall of the relay housing that provide downward-facing soldering pins and upward-facing quick-connect terminals. The use of the described contact rails, however, considerably increases the overall basal plane of the relay on the PCB (i.e. the "footprint" or the area of PCB surface occupied by the relay mounted thereon). Thus, the relay fails to conserve scarce (and, thus, valuable) board space, which is a standard design goal for PCB components.

In another known relay, described in European Patent Application EP-A-O 409 613, contact elements contained within the relay housing form soldering pins extending downward through a bottom wall as well as quick-connect terminals extending upward through a top wall of the housing. Disadvantageously, this arrangement requires the use of a specific relay and contact structure, i.e., it cannot be adapted for use by an existing PCB relay. Further, the described arrangement requires an increased total volume of the relay housing in order to provide sufficient space for the quick-connect terminals as well as the necessary insulation dimensions. Further, in both known relays, additional openings in the relay housing to accommodate quick-connect terminals render sealing of the housing more difficult and more costly.

It is therefore an object of the present invention to provide a PCB relay having an improved terminal structure allowing heavy load currents to be conducted away from a PCB by quick-connect terminals.

It is a further object of the present invention to provide quick-connect terminals on a PCB relay with little expenditure of cost and PCB space.

It is a still further object of the present invention to provide quick-connect terminals on a PCB relay without affecting the internal structure of the relay.

It is a still further object of the present invention to provide a quick-connect terminal structure which can be supplemented to an existing PCB relay simply by modifying a relay housing or cover without changing the internal relay and contact structure.

SUMMARY OF THE INVENTION

The aforementioned problems are obviated by the present invention which provides an improved PCB relay comprising a housing having a bottom side, a top side and a circumferential wall; soldering terminal pins protruding from said bottom side for being contacted to a printed circuit board; and at least two conducting strips fastened to and extending along said circumferential wall of said housing from said bottom side to said top side, said strips forming soldering pins at the bottom ends thereof and quick connect plugs or terminals at the top ends thereof.

BRIEF DESCRIPTION OF THE DRAWINGS

For a better understanding of the invention, reference is made to the following description of an exemplary embodiment thereof, and to the accompanying drawings, wherein:

FIG. 6 is a perspective view of a surface-mounted relay constructed in accordance with the present invention and a section of a printed circuit board for receiving the relay.

DETAILED DESCRIPTION

Figure 1:
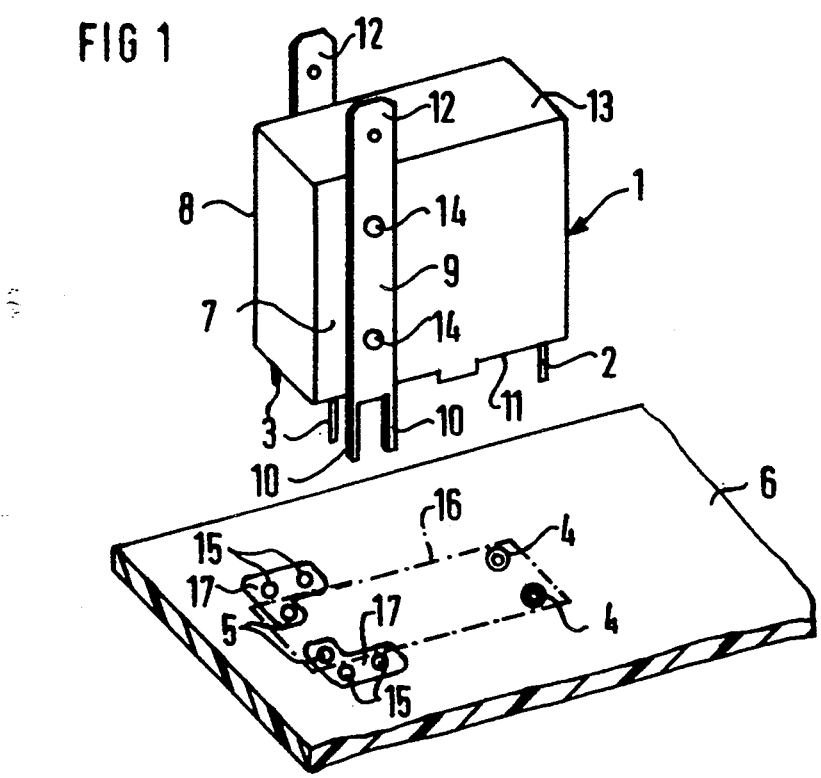
FIG. 1 is a perspective view of a relay constructed in accordance with the present invention and a section of a printed circuit board for receiving the relay.

FIG. 1 shows a relay constructed in accordance with the present invention. The relay has a cover 1 which forms the relay housing, the bottom part of which is not visible in the figure. The cover 1 may be manufactured with any relay housing material, such as, plastic. The internal structure of the relay, not shown, may be of any suitable kind, since the terminal structure of the relay (as described below) is independent of the internal structure. The relay has standard coil terminal pins 2 and standard contact terminal pins 3 that are configured to be inserted and soldered in respective contacting holes 4, 5 formed in a printed circuit board (PCB) 6. Note that the electrically conductive parts of the PCB 6 (e.g., the etched conductor paths) are provided on the bottom surface which is not visible in the figure.

The relay also has at least two conducting strips 9 which are fastened on opposite lateral sidewalls 7, 8 of the cover 1. The conducting strips 9 form respective soldering pins 10 at the bottom end thereof that extend beyond the bottom side 11 of the cover 1. The conducting strips 9 also form respective quick-connect terminals 12 at the top end thereof that extend beyond the top side 13 of the cover 1. The conducting strips 9 are fastened to the cover 1 by securely engaging respective knobs or pins 14 as described below with respect to FIGS. 2 and 5, but may be fastened to the cover 1 in any other manner. Note that both the soldering pins 10 and the quick-connect terminals 12 may be formed in any configuration as desired or required by the application.

For mounting the relay on the printed circuit board 6, the PCB 6 has additional contacting holes 15 formed therethrough which are configured to receive the soldering pins 10. The outline or footprint of the relay cover 1 when the relay is mounted on the PCB 6 is shown in the figure as a broken line 16. Note that the conducting strips 9 are configured to require only slightly more space on the PCB 6 than the relay cover 1; thus, scarce PCB surface is conserved.

For connecting the conducting strips 9 to the contact terminal pins 3, conducting paths 17 are formed on the surface of the printed circuit board 6 between the contacting holes 15 that accommodate the soldering pins 10 and corresponding contacting holes 5 that accommodate the contact terminal pins 3. Thus, in operation, heavy load currents switched by the relay contacts can be conducted quickly via a relatively short pathway from the contact terminal pins 3 to the quick-connect terminals 12.

Figure 2:
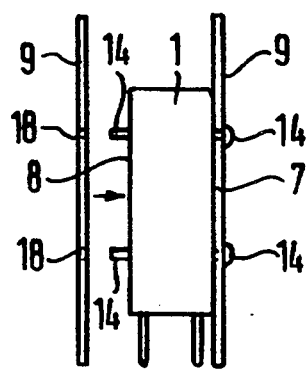
FIG. 2 is a front view of the relay of FIG. 1 with means for fastening conductor strips thereto.

FIG. 2 shows a front view of the relay and means for fastening the conducting strips 9 on the relay. As previously described, the cover 1 may have integrally-formed knobs or pins 14 extending from the lateral sidewalls 7, 8. The knobs 14 may be heat-deformable. The conducting strips 9 have bores 18 formed therethrough that are configured to engage or lock with the respective knobs or pins 14. After plugging the knobs 14 into the respective bores 18 of the strips 9, the knobs 14 are heat-deformed as shown on the right side of FIG. 2. The heat-deformed knobs 14 act as rivets to securely fasten the conducting strips 9 to the cover 1. Alternatively, the knobs 14 can also be configured as press-fit buttons, snappingly locking into the respective bores 18 of the strips 9. Notably, the conductor strips 9 may be adapted for use by an existing relay with little or no modification of the relay cover 1. Further, additional openings in the relay cover 1 are not necessary to utilize the conducting strips 9 and, thus, any problems pertaining to sealing the housing are avoided.

Figure 3:
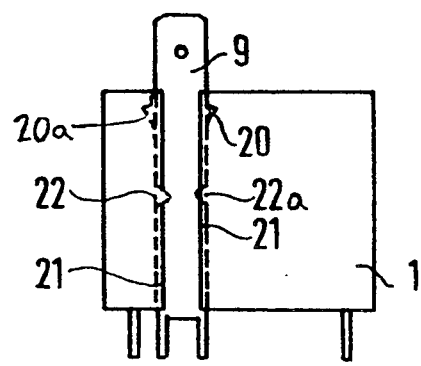
FIG. 3 is a lateral view and a top view of the relay of FIG. 1 with alternative means for fastening conductor strips thereto.
Figure 3:
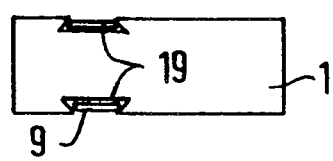

FIG. 3 shows a lateral view and a top view of the relay and an alternative means for fastening the conducting strips 9 on the cover 1. The cover 1 has vertical grooves 19 formed on the lateral sidewalls 7, 8, the edges 21 of which are undercut, for example, in a dovetail form. The conducting strips 9 are insertable in respective grooves 19 from either the top side 13 or bottom side 11 of the cover 1 and firmly held in place within the grooves 19. To secure the placement of the strips 9, the strips 9 can be locked within the vertical grooves 19 by means of lateral protrusions 20 that are integrally formed with the strips 9 and are configured to snap into corresponding recesses 20a formed in the cover 1. Locking of the conducting strips 9 may also be accomplished by heat-deforming the edges 21 of the grooves 19 (shown as deformed edges 22) to partially cover and entrap the strips 9. In such case, the conducting strips 9 may also have recesses 22a formed in the lateral sides thereof to permit heat-deformed material (i.e., the heat-deformed edges 22) of the cover 1 to be press-fitted into the recesses 22a.

Figure 4:
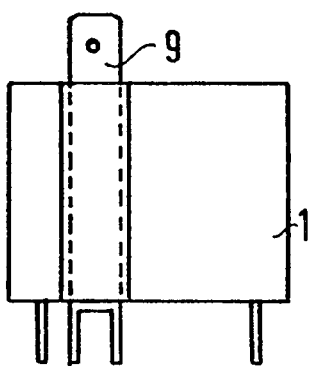
FIG. 4 is a lateral view and a top view of the relay of FIG. 1 with further alterative means for fastening conductor strips thereto.
Figure 4:
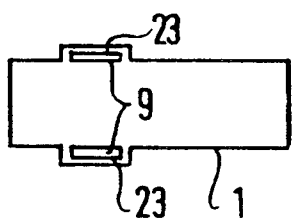

FIG. 4 shows a lateral view and a top view of the relay and another alternative means for fastening the conducting strips 9 on the cover 1. The conducting strips 9 are shown inserted into respective vertical channels 23 formed in the sidewalls 7, 8 of the cover 1. This has the advantage that the lateral sides of the conducting strips 9 are insulated by the cover 1 material without risking exposure of the internal relay structure as a result of sealing problems of the relay housing. Alternatively, instead of inserting the conducting strips 9 into the channels 23, the strips 9 may be embedded into the respective circumferential walls 7, 8 of the cover 1, for example, by injection molding.

Figure 5:
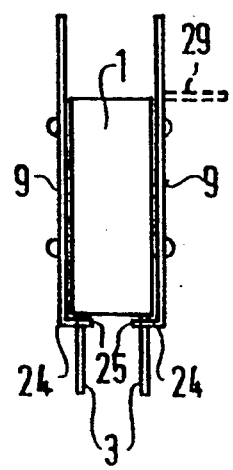
FIG. 5 is a front view of the relay of FIG. 1 with modified conducting strips fastened thereto.

FIG. 5 shows a front view of the relay with modified conducting strips 9 that facilitate the fastening to the cover 1. The conducting strips 9 are configured without soldering pins 10 formed at the bottom end thereof. The conducting strips 9 are connected directly to the contact terminal pins 3 of the relay at the bottom side 11 of the relay instead of being connected via the conducting paths 17. In particular, the lower ends 24 of the conducting strips 9 are angled inward (substantially perpendicular to the contact terminal pins 3) and have bores or eyelets 25 formed therethrough. For fastening the conducting strips 9 to the cover 1, the eyelets 25 are slipped over the contact terminal pins 3 so that the pins 3 extend therethrough. The strips 9 are then fastened to the sidewalls 7, 8 of the cover 1, for example, by means of deformable knobs 14 as described above or in any other manner. Advantageously, the printed circuit board 6 does not require additional contacting holes 15 for the soldering pins 10 or additional conducting paths 17 to connect the strips 9 to the pins 3. Note that the quick-connect terminals 12 of the strips 9 may be bent at substantially right angles to the strip 9, as shown by the broken-line quick-connect terminal 29.

The embodiments described herein are merely illustrative of the principles of the present invention. Various modifications may be made thereto by persons ordinarily skilled in the art, without departing from the scope or spirit of the invention. For example, the relay may be configured to be surface-mounted on the PCB 6. In such case, the coil terminal pins 2, the contact terminal pins 3, the conducting strips 9 and the connections and pathways therebetween (e.g., the conducting paths 17) may be re-configured to facilitate surface mounting of the relay. This is shown, for example, in FIG. 6 which shows a surface-mounted relay 1 constructed in accordance with the present invention. The conducting strips 9 are configured to have lower ends 30 which are angled outward from the sidewall 7. The coil terminal pins 32 and the contact terminal pins 33 are also angled outwardly. Further, the PCB 36 has soldering areas 34, 35 in place of contacting holes and has printed circuit paths 37 formed on the conductor surface of the PCB 36.

What is claimed is:

1. In a printed circuit board relay comprising a housing having a bottom side, a top side and a circumferential wall and terminal pins protruding from said bottom side for being contacted to a printed circuit board, wherein the improvement comprises: at least two conducting strips fastened to and extending along said circumferential wall of said housing from said bottom side to said top side, said conducting strips forming soldering pins at the bottom ends thereof and quick connect terminals at the top ends thereof.

2. In the relay according to claim 1, wherein said conducting strips are adapted to be fastened to said housing by securely engaging respective pins protruding from the circumferential wall of said housing.

3. In the relay according to claim 1, wherein said conducting strips have respective bores formed therethrough and wherein said conducting strips are adapted to be fastened to said housing by snappingly locking the bores onto respective locking knobs protruding from the circumferential wall of said housing.

4. In the relay according to claim 1, wherein said conducting strips are adapted to be fastened to said housing by insertion into respective undercut grooves formed on the circumferential wall of said housing.

5. In the relay according to claim 1, wherein said conducting strips further comprise respective integrally-formed lateral projections and wherein said conducting strips are adapted to be fastened to said housing by insertion into respective undercut grooves formed on the circumferential wall of said housing and by interlocking of said lateral projections with respective recesses of the circumferential wall formed within said undercut grooves.

6. In the relay according to claim 1, wherein said conducting strips are adapted to be fastened to said housing by insertion into respective undercut grooves formed on the circumferential wall of said housing and by securely engaging the undercut edges of said grooves.

7. In the relay according to claim 1, wherein said conducting strips are adapted to be fastened to said housing by insertion into respective channels formed within the circumferential wall of said housing.

8. In the relay according to claim 1, wherein said conducting strips are adapted to be embedded within the circumferential wall of said housing, said soldering pins extending from the bottom side of said housing and said quick-connect terminals extending from the top side of said housing.

9. In combination, the relay according to claim 1 and a printed circuit board, wherein said printed circuit board has first contacting holes formed therethrough for receiving said terminal pins protruding from the bottom side of the housing; second contacting holes formed therethrough for receiving said soldering pins of the conducting strips; and a conducting path formed thereon that connects each of said second contacting holes to at least one of said first contacting holes.

10. In a relay comprising a housing having a bottom side, a top side and a circumferential wall and terminal pins protruding from said bottom side for being contacted to a printed circuit board, wherein the improvement comprises: at least two conducting strips fastened to and extending along said circumferential wall of said housing from said bottom side to said top side, each of said conducting strips having a top end and a bottom end, said top end forming a quick-connect terminal and said bottom end being connected to one of said terminal pins protruding from the bottom side of the housing.

11. In combination, (a) a relay comprising a housing having a bottom side, a top side and a circumferential wall; terminal contacts on said bottom side for being electrically connected to an electrical circuit formed on a printed circuit board; and at least two conducting strips fastened to and extending along said circumferential wall of said housing from said bottom side to said top side, each of said conducting strips having a top end and a bottom end, said top end forming a quick-connect terminal and said bottom end being electrically connected to one of said terminal contacts and (b) a printed circuit board for mounting the relay thereon, said printed circuit board having formed thereon an electrical circuit and first contacts for electrically connecting said terminal contacts of the relay to the electrical circuit.

12. The combination of claim 11, wherein the relay is surface-mounted on the printed circuit board.

13. The combination of claim 11, wherein the printed circuit board further has formed thereon second contacts for electrically connecting to said bottom ends of the conducting strips and a conducting path that electrically connects each of said second contacts to at least one of said first contacts so that the bottom ends of the conducting strips are electrically connected to the terminal contacts.

14. The combination of claim 13, wherein the relay is surface-mounted on the printed circuit board.

* * * * *